United States Patent [19]
Thakoor

[11] Patent Number: 5,372,859
[45] Date of Patent: Dec. 13, 1994

[54] ENHANCED FATIGUE AND RETENTION IN FERROELECTRIC THIN FILM MEMORY CAPACITORS BY POST-TOP ELECTRODE ANNEAL TREATMENT

[75] Inventor: Sarita Thakoor, Covina, Calif.

[73] Assignee: The United States of America as represented by the Administrator of the National Aeronautics and Space Administration, Washington, D.C.

[21] Appl. No.: 963,974

[22] Filed: Oct. 20, 1992

[51] Int. Cl.⁵ .................... B05D 3/06; B05D 5/12; B05D 3/02
[52] U.S. Cl. .................... 427/551; 427/554; 427/559; 427/80; 427/376.4; 427/376.7; 427/376.2
[58] Field of Search ............... 427/554, 555, 556, 559, 427/551, 552, 80, 79, 376.7, 376.2, 376.4

[56] References Cited
U.S. PATENT DOCUMENTS

| | | | |
|---|---|---|---|
| 4,195,355 | 3/1980 | Rohrer | 365/145 |
| 4,232,094 | 11/1980 | Rhodes et al. | 427/551 |
| 4,701,592 | 10/1987 | Cheung | 219/121.77 |
| 4,772,985 | 9/1988 | Yasumoto et al. | 361/321 |
| 4,865,923 | 9/1989 | Ralston et al. | 427/552 |
| 5,027,253 | 6/1991 | Lauffer et al. | 361/321 |
| 5,029,128 | 7/1991 | Toda | 365/145 |
| 5,031,143 | 7/1991 | Jaffe | 365/145 |
| 5,031,144 | 7/1991 | Persky | 365/145 |
| 5,046,043 | 9/1991 | Miller et al. | 365/145 |
| 5,053,917 | 10/1991 | Miyasaka et al. | 361/321 |
| 5,070,026 | 12/1991 | Greenwald et al. | 437/3 |
| 5,072,329 | 12/1991 | Galvagni | 361/321 |
| 5,088,002 | 2/1992 | Ogawa | 361/321 |
| 5,089,426 | 2/1992 | Yamazaki et al. | 437/3 |
| 5,089,932 | 2/1992 | Saito et al. | 361/321 |
| 5,094,977 | 3/1992 | Yu et al. | 427/556 |
| 5,198,269 | 3/1993 | Swartz et al. | 427/126.2 |

Primary Examiner—Marianne Padgett
Attorney, Agent, or Firm—John H. Kusmiss; Thomas H. Jones; Guy M. Miller

[57] ABSTRACT

Thin film ferroelectric capacitors (10) comprising a ferroelectric film (18) sandwiched between electrodes (16 and 20) for nonvolatile memory operations are rendered more stable by subjecting the capacitors to an anneal following deposition of the top electrode (20). The anneal is done so as to form the interface (22) between the ferroelectric film and the top electrode. Heating in an air oven, laser annealing, or electron bombardment may be used to form the interface. Heating in an air oven is done at a temperature at least equal to the crystallization temperature of the ferroelectric film. Where the ferroelectric film comprises lead zirconate titanate, annealing is done at about 550° to 600° C. for about 10 to 15 minutes. The formation treatment reduces the magnitude of charge associated with the non-switching pulse in the thin film ferroelectric capacitors. Reduction of this charge leads to significantly more stable nonvolatile memory operations in both digital and analog memory devices. The formation treatment also reduces the ratio of change of the charge associated with the non-switching pulse as a function of retention time. These improved memory devices exhibit greater performance in retention and reduced fatigue in memory arrays.

14 Claims, 7 Drawing Sheets

ENHANCED FATIGUE AND RETENTION IN FERROELECTRIC THIN FILM MEMORY CAPACITORS BY POST-TOP ELECTRODE ANNEAL TREATMENT

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to thin film ferroelectric capacitors, and, more particularly, to processes for providing enhanced non-volatile ferroelectric memories.

BACKGROUND ART

With the advances in technology to deposit thin films of lead zirconate titanate (PZT) and integrate them with conventional silicon technology, ferroelectric non-volatile memories are now well into their development phase. The memory element consists of a thin film ferroelectric capacitor, in which the non-volatile storage is based on the remanent polarization within the ferroelectric thin film. The established readout technique relies upon the transient displacement current induced by polarization reversal under an applied switching pulse.

However, the thin film ferroelectric capacitors as deposited have slow switching polarization components and undergo time-activated depolarization that cause instability in memory operation. Accordingly, there is a need to provide a process which improves the stability of the thin film ferroelectric capacitors.

STATEMENT OF THE INVENTION

Accordingly, it is an object of the invention to provide more stable thin film ferroelectric capacitors for memory applications.

In accordance with the invention, a processing technique is provided which comprises an anneal of the thin film ferroelectric capacitor following deposition of the top electrode (post-top electrode anneal). In a conventional DRO (destructive read-out) memory operation, the charge associated with the non-switching pulse is called "Q2". The post-top electrode anneal reduces appreciably this charge Q2 and its rate of change with retention time, t, which is given by dQ2/dt. This charge Q2 probably arises due to slow switching polarization components (attributed to lack of grain orientation, defect dipoles, slow domain kinetics, and/or slow reorientation of space charge residing at the traps or in the grain boundaries) and time-activated depolarization (unstable domains and/or slow reorientation of space charge residing at the traps or in the grain boundaries) occurring in the ferroelectric thin film. The anneal treatment of the present invention thus leads to a ferroelectric memory with enhanced retention and fatigue characteristics. This anneal treatment results in forming the ferroelectric memory capacitor by forming the interface between the top electrode and the ferroelectric film and improving the ferroelectric thin film quality by improving the crystallization/grain orientation of the film and/or reducing the trap density within it.

The procedure employed to reduce the charge associated with the non-switching pulse comprises a treatment of the thin film ferroelectric capacitor that assists the formation of the interface between the top electrode and the ferroelectric film.

Depending on the origin (deposition process conditions and thermal history) and composition of the ferroelectric film and the geometry, electrode thickness, and size of the devices, the actual value of anneal temperature used for this formation process may vary from case to case. However, the critical feature of this invention is the identification of the two physical boundary conditions within which the interface formation of the device is realized, that leads to enhanced performance. This post-top electrode deposition formation temperature needs to be preferably above the crystallization temperature of the deposited ferroelectric film but should certainly be below the temperature where metal-rich (i.e., Pb in the case of lead zirconate titanate) filament formation, causing an increase in leakage current, starts to occur. As an example, in the case of lead zirconate titanate ferroelectric films, the lower and upper boundary conditions are about 550° C. and 600° C., respectively, with a preferred annealing temperature of about 560° C.

BRIEF DESCRIPTION OF THE DRAWINGS

FIG. 2 depicts the typical destructive read-out (DRO) measurement pulse sequence as a function of time t for measuring Q1 (charge per unit area) corresponding to a switching pulse R1 followed by measurement of Q2 (charge per unit area) corresponding to a non-switching pulse R2; specifically.

DETAILED DESCRIPTION OF THE INVENTION

Figure 1:
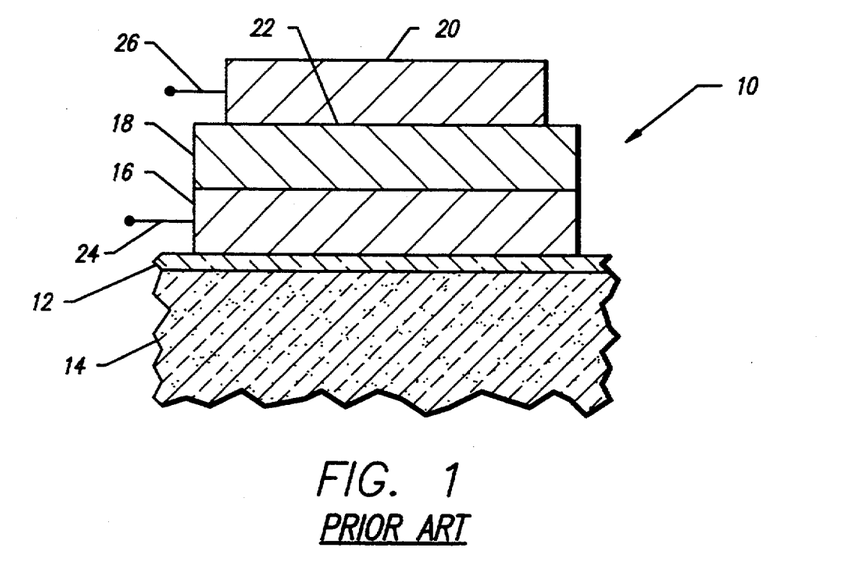
FIG. 1 is a cross-sectional view of a generic ferroelectric thin film capacitor device configuration.

Referring now to the drawings, wherein like numerals designate like elements, FIG. 1 shows a typical ferroelectric thin film capacitor 10, formed on an insulating film 12 of SiO$_2$, supported on a silicon substrate 14. The capacitor 10 comprises a bottom electrode 16, a ferroelectric layer 18 formed thereon, and a top electrode 20, formed on the ferroelectric layer, defining an interface 22 between the two layers. Contacts 24 and 26 are made to bottom electrode 16 and top electrode 20, respectively. The electrodes provide polarization control, for either read or write operations.

The bottom and top electrodes 16 and 20 each typically comprise platinum, although other conducting materials may also be employed. Specifically, the bottom electrode 16 comprises a bilayer constituted of titanium followed by platinum, as is well-known; this material provides a good passivation on top of the silica layer 12. The top electrode 20 may alternately comprise an electrically conducting oxide, such as indium tin oxide (ITO) or ruthenium oxide. In another implementation, both the top and bottom electrodes may be the perovskite high $T_c$ compounds yttrium barium copper oxide (YBCO) or lanthanum strontium copper oxide (LSCO).

Previous work with use of platinum as the top electrode 20 has been with relatively thick layers, on the order of 3,000 Å. However, the present inventor has discovered that use of a much thinner layer for the top electrode 20, on the order of 100 to 300 Å, renders the device more symmetric in its measured properties. Specifically, the hysteresis loop (polarization as a function of electric field) evidences greater symmetry with a thin top electrode than with a thick top electrode.

The ferroelectric layer may comprise any of the well-known ferroelectric materials. Lead zirconate titanate (PbZr$_{0.53}$Ti$_{0.47}$O$_3$), also known by the acronym PZT, is a well-characterized material widely used in ferroelectric memories, and is accordingly preferred. Although the disclosure herein is given specifically in terms of PZT, it will be appreciated that any ferroelectric material, particularly the titanates having the perovskite crystal structure, may be processed in accordance with the teachings of the invention, and accordingly, the invention is not limited to the use of PZT alone. For memory devices employing PZT, it is preferred that the ratio of Zr:Ti be in the range of about 60:40 to 50:50.

The thickness of the PZT layer may range from about 0.10 to 0.20 μm. A thickness greater than about 0.20 μm either results in stress cracking, such as resulting from use of a sol-gel process, or in an unacceptably long time to fabricate, such as in metal-organic chemical vapor deposition, sputtering, or laser ablation.

The ferroelectric thin film capacitor 10 may be employed as either an electrically or an optically addressable memory unit in an array of capacitors, as is well-known.

Figure 2A:
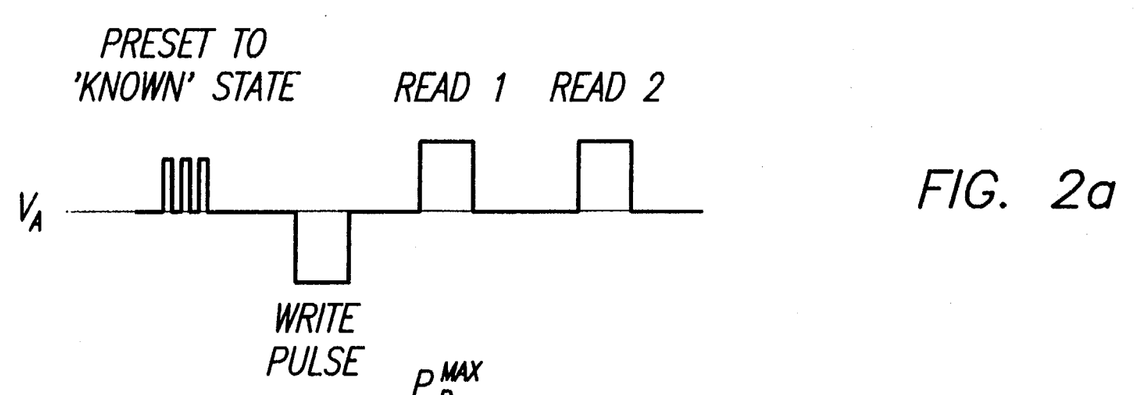
FIG. 2a depicts a burst of pulses as a preset sequence, followed by a write pulse, a switching pulse, and a non-switching pulse.

The typical DRO measurement pulse sequence schematically illustrated in FIG. 2 consists of measuring the charge Q1 corresponding to the switching pulse R1 followed by the measurement of the charge per unit area Q2 corresponding to the non-switching pulse R2. These measurements are obtained by monitoring the response voltage $V_S$ to the applied pulses, R1 and R2, respectively. ($V_S$ is the voltage across a sampling capacitor in the virtual ground/Sawyer Tower circuit, known in the prior art.) In the measurement, a burst of pulses is used as a preset sequence, followed by a write pulse, the switching pulse R1, and the non-switching pulse R2, at an applied pulse voltage $V_A$, as shown in FIG. 2a.

Figure 2B:
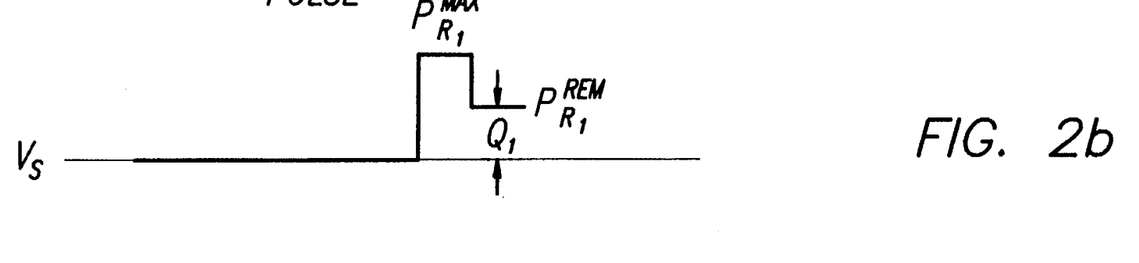
FIG. 2b illustrates the determination of Q1.
Figure 2C:
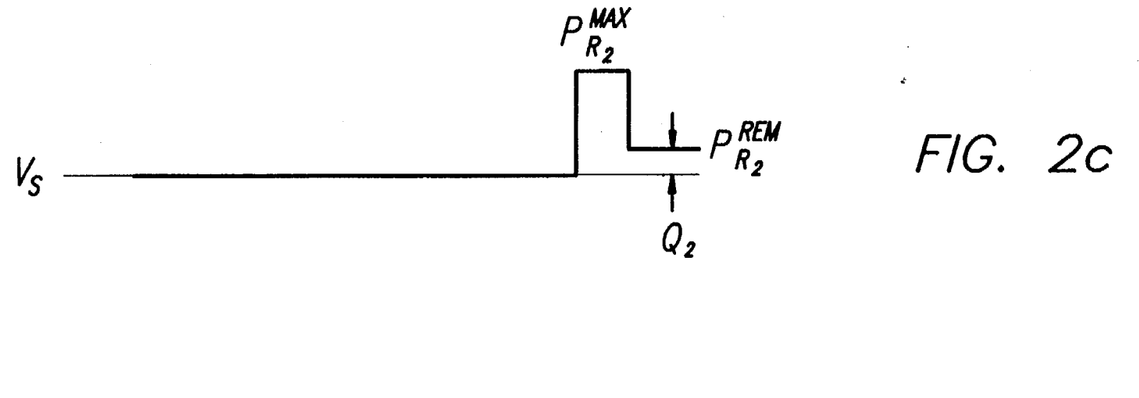
FIG. 2c illustrates the determination of Q2.

FIG. 2b and FIG. 2c illustrate the determination of Q1 and Q2, respectively. The memory signal M effectively consists of the difference of Q1 and Q2. For a destructive readout of the memory, a difference is determined of the corresponding points on the response profiles depicted in FIGS. 2b and 2c. $M = P_{R1}^{MAX} - P_{R2}^{MAX} = P_{R1}^{REM} - P_{R2}^{REM}$, where the labels $P_{R1}^{MAX}$, $P_{R2}^{MAX}$, $P_{R1}^{REM}$, and $P_{R2}^{REM}$ are defined in FIGS. 2b and 2c. Specifically, FIG. 2b is the output voltage sensed corresponding to the switching pulse identified as READ1. $P_{R1}^{MAX}$ is the upper level and $P_{R1}^{REM}$ is the lower level. FIG. 2c is the output voltage sensed corresponding to the non-switching pulse identified as READ2. $P_{R2}^{MAX}$ is the upper level and $P_{R2}^{REM}$ is the lower level. In the present invention, the physical parameters Q1 and Q2 are studied individually as a function of the anneal conditions and retention time to demonstrate their individual effect on the memory characteristics.

For a typical experiment, the Q1 and Q2 values are measured in both the positive as well as negative direction as a function of the parameter under study. A measure of the memory M is obtained by the difference between the charges Q1 and Q2.

The retention measurement consists in writing the memory by using a fixed programming pulse and reading the memory after an interim time t, which is the variable. For non-volatile memory operation, retention with time is the most important characteristic.

Figure 3:
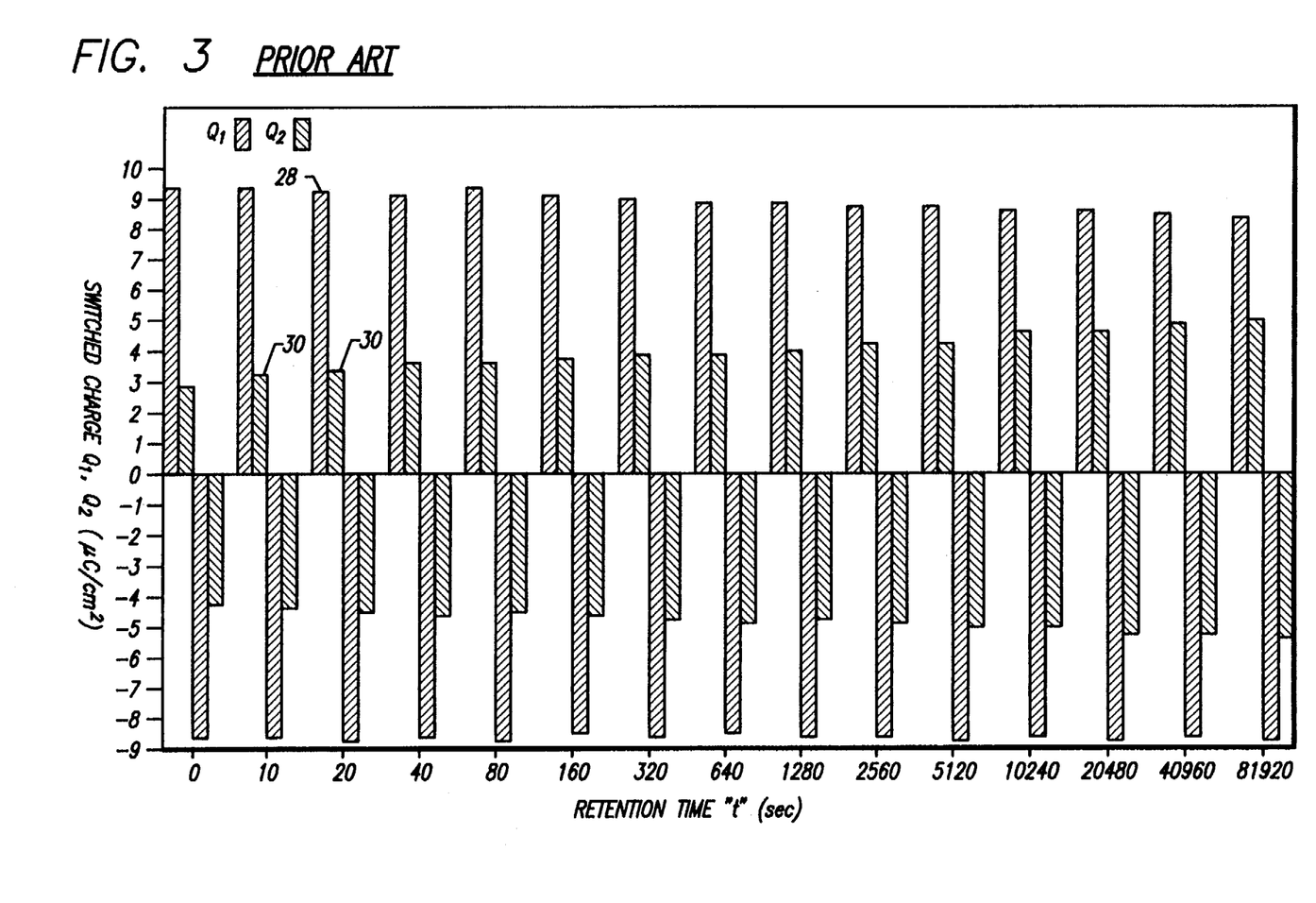
FIG. 3 is a histogram plot, showing the typical retention characteristics of a ferroelectric capacitor where the top electrode is as deposited.

FIG. 3 illustrates the typical retention characteristics of a ferroelectric capacitor where the top electrode is as deposited. It will be noticed that although Q1 28 is reducing slowly as expected as a logarithmic function of retention time t, it is the rapid rise in the value of Q2 30 as a function of retention time that contributes to the rapid effective loss of the retained memory signal. Therefore, for enhanced memory characteristics, it would be desirable to find a way to reduce Q2 30 and also keep its value substantially steady as a function of the retention time.

In the current state-of-the-art thin film ferroelectric capacitor devices 10, the bottom platinum electrode 16 undergoes an anneal along with the crystallization anneal of the ferroelectric film 18, here, PZT, whereas the top platinum electrode 20 is laid down cool, thus the device structure forms an asymmetric Schottky barrier. PZT thin films are deposited by a variety of techniques. Several deposition techniques result in PZT films that are amorphous in their as-deposited form (e.g., sol-gel). Such films are then subjected to an anneal (which is shared by the bottom electrode) to obtain well-crystallized films in the specific crystalline structure and grain orientation desired for ferroelectric properties. This temperature is identified as the crystallization temperature. In other deposition techniques, the deposition itself may be done at an elevated temperature to assist crystallization and grain orientation of the film.

In accordance with the invention, a post-top electrode deposition anneal treatment (annealing of the device following deposition of the top electrode 20 on the ferroelectric film 18) is developed that makes the interface contacts electrically more symmetric. In addition, this treatment possibly helps to anneal out traps, reducing the trap density, thereby reducing the space charge effect. Also, this anneal may further improve the crystallization of the PZT and the grain orientation. Thus, the slow switching polarization components and time-activated depolarization are considerably reduced.

The annealing treatment of the invention is done at a temperature at or above the crystallization temperature of the ferroelectric film. For PZT, the crystallization temperature is about 550° C.

However, the annealing temperature cannot be too high, since it causes the leakage current in the ferroelectric device to increase and hence degrade the device, due to the formation of metal-rich filaments (Pb, in the case of PZT). Accordingly, the annealing temperature should not exceed the crystallization temperature by more than about 50° C. Thus, the annealing range for PZT is about 550° to 600° C. An annealing temperature of about 560° C. has been observed to provide the best results, and accordingly, that temperature is preferred for annealing.

Depending on the origin (deposition process conditions and thermal history) of the PZT film and the geometry, electrode thickness, and size of the devices, the actual value of anneal temperature used for this formation process may vary from case to case. However, the critical feature of this invention is the identification of the two physical boundary conditions within which the interface formation of the device is realized, that leads to enhanced performance. This post-top electrode deposition formation temperature needs to be preferably above the crystallization temperature of the deposited PZT but should certainly be below the temperature where metal-rich filament formation, causing an increase in leakage current, starts to occur.

Annealing is done by placing the devices in an oven, pre-heated to the desired temperature. Rapid insertion of the devices into the oven, allowing the devices to thermally equilibrate, maintaining the devices in the oven for a period of time, and then rapid extraction of the devices from the oven is the preferred process. In most instances, the time in the oven is about 10 to 15 minutes.

It has been found that treatment of the interface 22 between the ferroelectric film 18 and the top electrode 20 in accordance with the teachings of this invention is the key to realizing a device with improved characteristics 10. While thermal annealing in an oven is one way to realize the benefits of the invention, there are other ways to affect this interface 22 that also result in improved devices. Laser annealing is another technique that leads to the interface formation in a localized manner. Still another technique involves electron bombardment.

Laser annealing is accomplished at a energy of about 20 to 40 mJ/cm$^2$; values greater than about 40 mJ/cm$^2$ tend to ablate the top electrode 20. Preferably, laser annealing is done at about 20 to 24 mJ/cm$^2$. Less than 1 sec of a cumulative exposure to the laser pulse is required to achieve the desired formation. As an example, the annealing was done using a 10 ns pulse at 10 Hz frequency for about 32 hours, yielding a cumulative exposure of about 0.01 sec.

Electron bombardment is done at a fluence greater than about $10^{13}$ electrons/cm$^2$, and less than about $10^{14}$ electrons/cm$^2$. The former value has no apparent effect on the device, while the latter value results in devices with enhanced characteristics indicative of a formed interface.

The treatment of the interface 22 in accordance with the invention reduces scatter in the values of Q1 28 and Q2 30, reduces Q2, and enhances resistance to fatigue. Q1 and Q2 are the charges on the capacitor associated with a switching pulse and a non-switching pulse, respectively.

Reduction of scatter in the values of Q1 28 and Q2 30 is a measure of uniformity from device to device, and is a desired result. A reduction in Q2 and a marked decrease in its rate of increase with retention time t (dQ2/dt is reduced) make available more retained memory signal over a longer retention period, thus enhancing the overall retention characteristics. Finally, prior art devices show sufficient fatigue (reduction of polarization to $<1$ $\mu$C/cm$^2$, the minimum differentiable signal) after about $10^{11}$ cycles at $10^5$ Hz to render the device useless for storing a signal; this translates to a time period of use of about 12 days. Increasing the number of cycles before sufficient fatigue sets in by a few of orders of magnitude would increase the useful lifetime of the device to over three years. Treatment by the process of the invention renders the device usable with detectable polarization of $>1$ $\mu$C/cm$^2$ to over $10^{13}$ cycles as seen by extrapolating the observed results.

In effect, the anneal treatment in accordance with the invention improves the dielectric constant of the ferroelectric material, increases the dielectric breakdown strength, reduces the barrier at the ferroelectric/electrode interface, and reduces the fatigue rate, thereby making the memory significantly improved in terms of fatigue and retention characteristics.

EXAMPLE

Sol-gel lead zirconate titanate (PbZr$_{0.53}$Ti$_{0.47}$O$_3$) thin films were obtained from Raytheon Company; these films had been deposited by a modified Sayer's Technique on oxidized silicon substrates covered with an evaporated Ti/Pt ($\approx$1,000 Å/1,000 Å) base electrode. Typically, the PZT composition of (Zr/Ti=53/47) with $\approx$18% excess lead was investigated; these PZT films were about 1,700 Å thick.

Crystallization of the as-deposited PZT was accomplished at 550° C. for 10 minutes in 100% oxygen. To complete a conventional sandwich capacitor test structure, thin films of platinum (about 100 to 150 Å) were deposited as the top electrode. The top electrodes were patterned by conventional lift-off techniques as dots of 250 $\mu$m diameter. Optical transmission through the top electrode films ($\lambda$=300 to 800 nm) was about 30%.

The foregoing device configuration was used in the practice of the invention. The anneal treatments were done on devices fabricated as above, and the appropriate conditions for each treatment were thereby determined.

The measurement consisted of measuring the charge Q1 corresponding to a switching pulse R1 followed by the measurement of the charge Q2 corresponding to a non-switching pulse R2. For a typical experiment, the Q1 and Q2 values were measured in both the positive as well as negative direction as a function of the parameter under study. A burst of 20 pulses was used as the preset sequence for all experiments (except for the retention experiment, where a burst of 6 pulses was utilized for preset). The time gap between the write and first read pulse was about 1.5 seconds and the time gap between the consecutive reads was about 2.5 seconds for all experiments.

Annealing of the ferroelectric capacitors following deposition of the top electrode was done in an open air furnace by rapid insertion and extraction of the sample at the desired annealing temperature. For a survey of the effects of annealing, three different batches of thin film ferroelectric capacitors were annealed at 200° C., 400° C., and 600° C. Measurements of Q1 and Q2 in both directions were then made, where Q1 and Q2 each are integrated charge measured with a sampling capacitor, the former measured by a switching pulse and the latter by a non-switching pulse applied to the ferroelectric capacitor.

The optical probing described herein consisted of measuring the steady zero bias photocurrent response from the thin film ferroelectric capacitor as a function of operation cycles for the unannealed samples and samples annealed after deposition of the top electrode at the different annealing temperatures. This steady photoresponse was found to be an indicator of the status of the two PZT/platinum interfaces. This steady response is the net photovoltaic current due to two back-to-back Schottky barriers or the stress gradient residing within the PZT film due to the processing history. The steady current measurement was done after the illumination pulse was on for 60 seconds to ensure that the contribution due to the initial space charge effected transient had completely relaxed.

Figure 4:
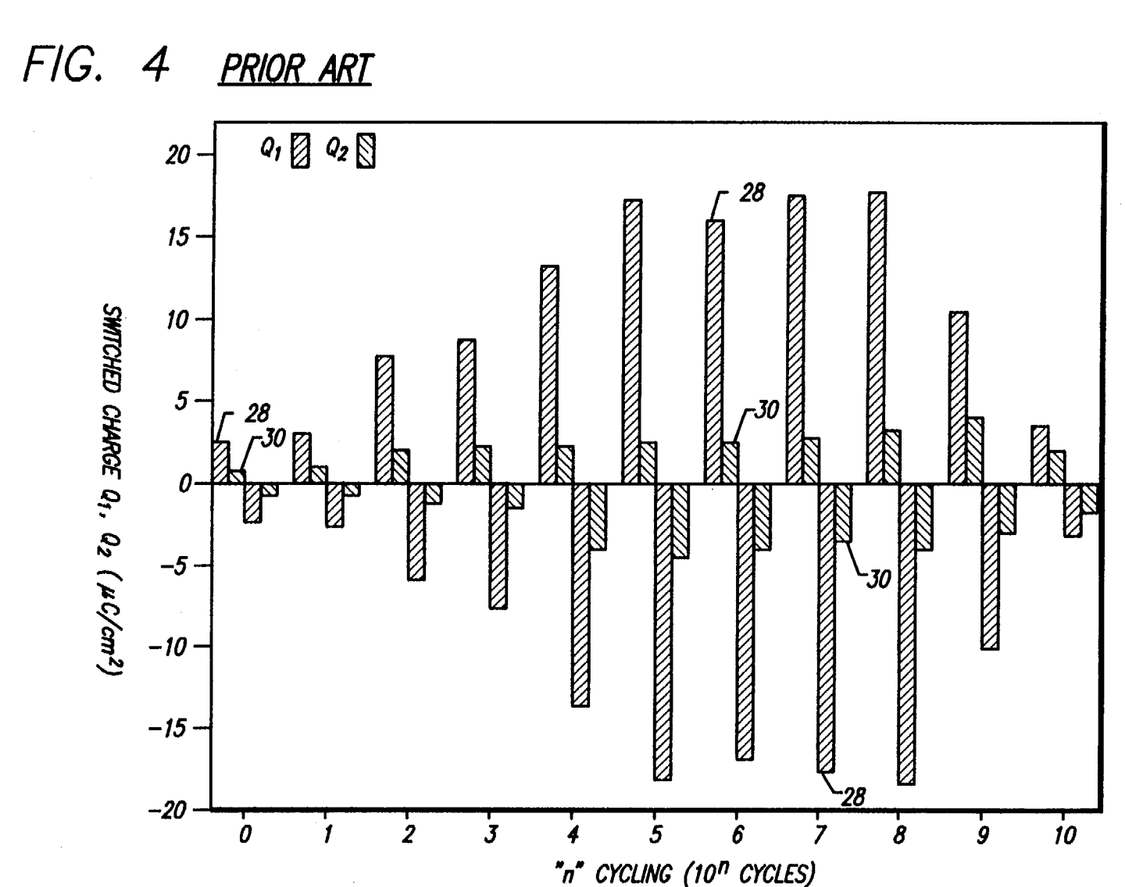
FIG. 4 is a histogram plot, showing the effect of counted pulses from 0 cycles onwards to $10^{10}$ cycles on the Q1 and Q2 values both in the positive and negative direction, where Q1 is the charge on the capacitor associated with a switching pulse and where Q2 is the charge on the capacitor associated with a non-switching pulse.

FIG. 4 shows the effect of counted pulses from 0 cycles onwards to $10^{10}$ cycles on the Q1 28 and Q2 30 values both in the positive and negative directions. The device exhibits low polarization in the virgin state (at 0 cycles). With voltage cycling, the polarization improves, the peak value is achieved at about $10^5$ cycles, then a plateau is maintained up to about $10^7$ to $10^8$ cycles. Beyond that, the device starts degrading in its polarization value rapidly, exhibiting fatigue related with polarization switching. This characteristic is very typical of different devices made from different batches of the PZT. Without subscribing to any particular theory, it appears that the electrode/ferroelectric interface 22 of the device undergoes a formation process related with changes in the interface chemistry and built-in stress at the interface originating from the processing of the PZT and device fabrication.

Figure 5:
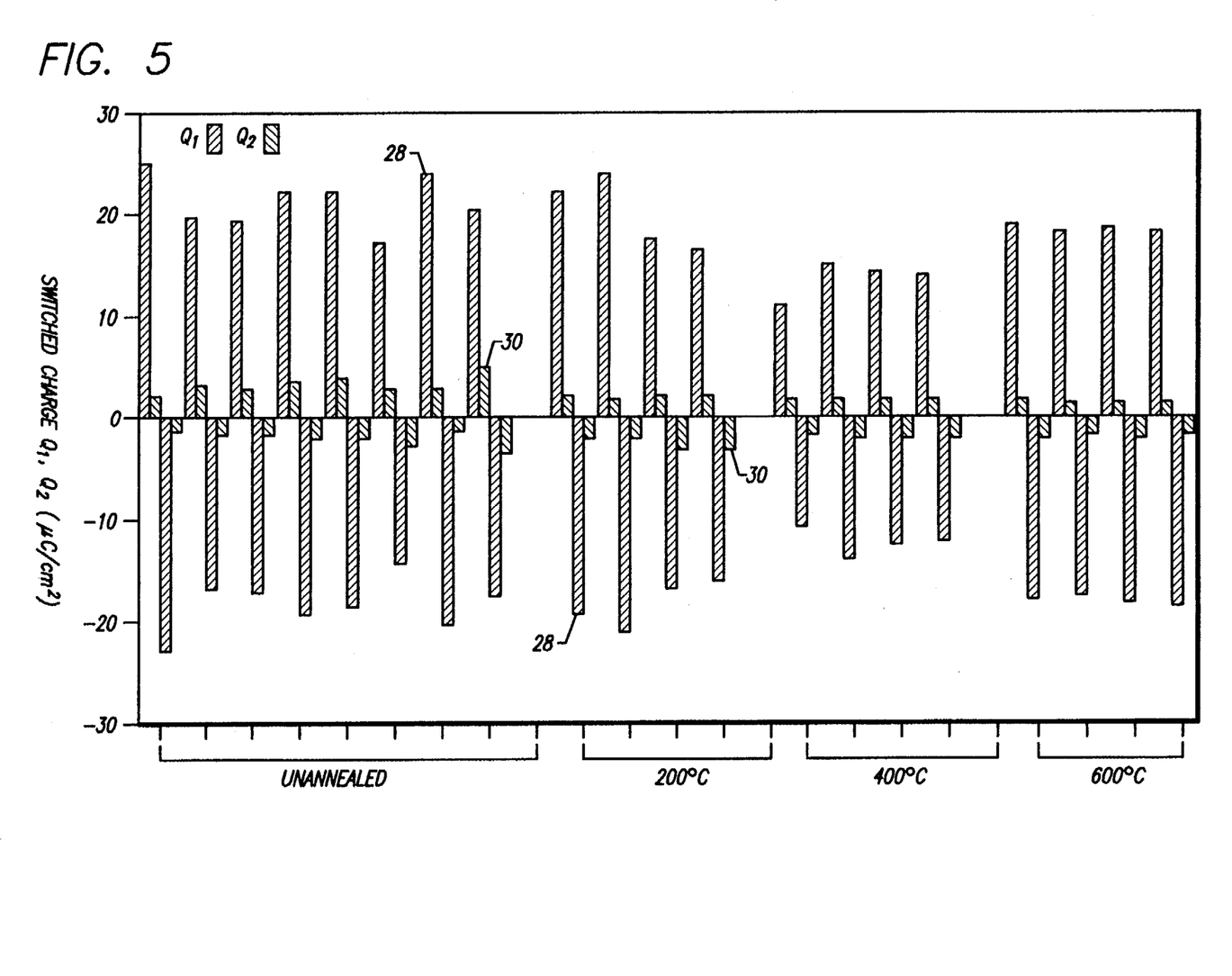
FIG. 5 is a histogram plot similar to that of FIG. 4, but depicting the Q1 and Q2 values for the ferroelectric thin film capacitors as-deposited without annealing after deposition of the top electrode and with annealing at 200° C., 400° C., and 600° C.

FIG. 5 presents a comparative survey of Q1 and Q2 values for the as-deposited unannealed thin film ferroelectric capacitor and for thin film ferroelectric capacitors annealed after top electrode deposition, the annealing done at 200° C., 400° C., and 600° C., as described above. Typical results as illustrated in FIG. 3 suggest the occurrence of two important effects. Annealing the device above the Curie point ($\approx 375°$ C. for PZT) makes the device more symmetric with respect to its polarization values in both the positive and negative direction. This may be occurring due to thermal depoling of the PZT above the Curie temperature or an associated stress release mechanism. The role of the PZT/top electrode interface 22 is crucial because annealing is observed to affect the device quality only if it is done after the deposition of the top electrode 20. The Q1 28 and Q2 30 values are reduced successively as the anneal temperature is increased. However, annealing at temperatures above the crystallization temperature ($>550°$ C. for PZT) continues to reduce the Q2 values but a distinct increase in the Q1 value is observed, effectively yielding a higher remanent polarization value (Q1−Q2).

Figure 6:
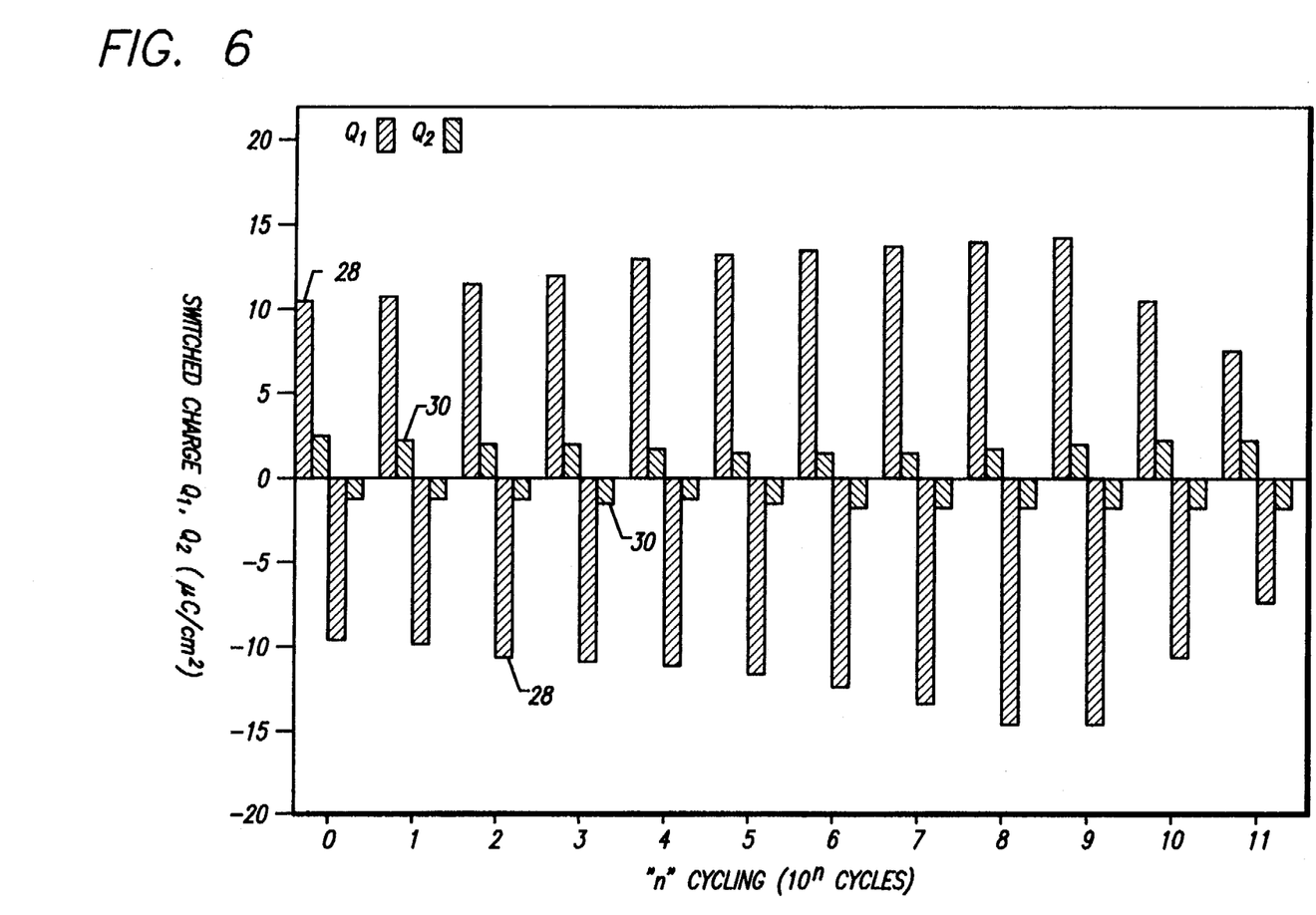
FIG. 6 is a histogram plot similar to that of FIG. 4, but depicting the Q1 and Q2 values for the ferroelectric thin film capacitors with annealing at 560° C.

It will also be noted that the anneal treatment above the crystallization temperature, that is, in the range from 550° to 600° C., markedly reduces the device-to-device scatter on the chip. FIG. 6 shows the Q1 28 and Q2 30 values for a post-top electrode annealed thin film ferroelectric capacitor (annealed at 560° C.) as a function of the voltage cycling. The anneal treatment is perceptibly accelerating the formation process so that even at 0 cycles a substantial polarization of 8 $\mu$C/cm$^2$ is obtained. The fatigue characteristics are improved such that the device maintains the polarization value of 8 $\mu$C/cm$^2$ up to over $10^{10}$ cycles of operation, thus extending its useful lifetime.

Figure 7:
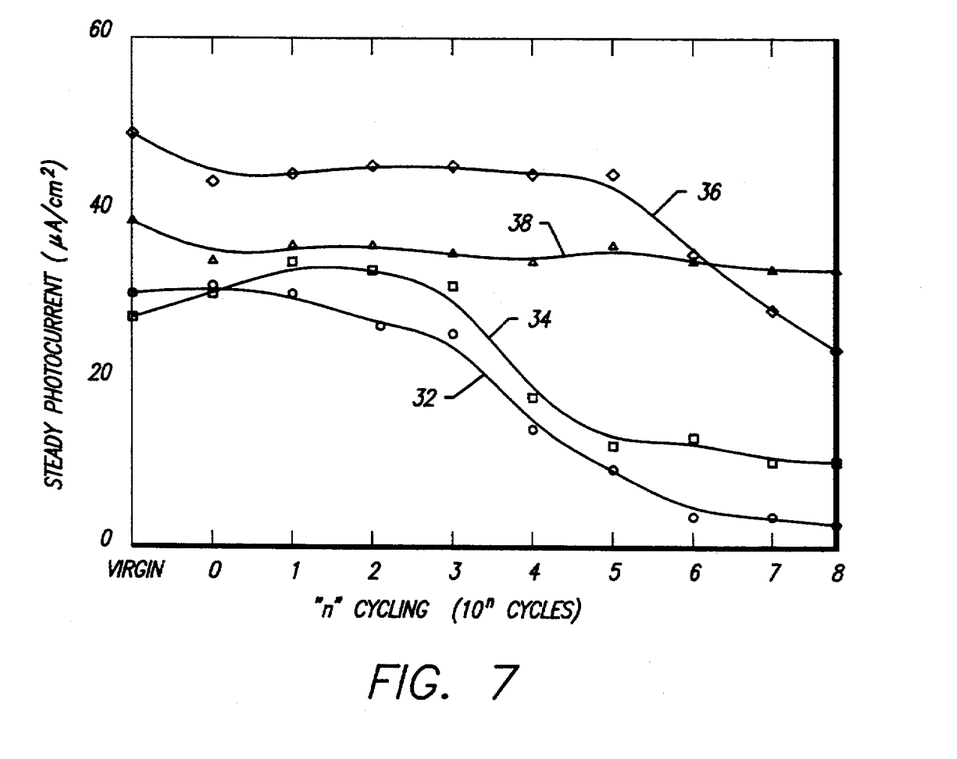
FIG. 7 is a plot of steady photoresponse as a function of cycling for unannealed and annealed ferroelectric thin film capacitors.

FIG. 7 exhibits the steady photoresponse as a function of the cycling for the unannealed (Curve 32) and post-top-electrode annealed thin film ferroelectric capacitors. The photoresponse serves as a good indicator of the formation of the ferroelectric/electrode interface 22. The device annealed at 400° C. (Curve 34) is not significantly different from the unannealed device (Curve 32) in terms of formation. However, formation is seen to initiate at 500° C. (Curve 36), and optimum formation is obtained in the range of about 550° to 600° C., as indicated by the result for 560° C. (Curve 38).

As seen from the foregoing data, the PZT/electrode interface 22 undergoes a formation process to form the ferroelectric memory capacitor. The formation process can be controlled by localized agitation treatments such as annealing to yield devices of markedly enhanced stability, reduced device-to-device scatter, and enhanced retention as well as fatigue characteristics. A device with 8 $\mu$C/cm$^2$ of remanent polarization all the way from 0 cycles to over $10^{10}$ cycles of operation has been demonstrated.

The steady photocurrent response serves as a good indicator of the formation process because it undergoes a reduction in value when formation takes place and remains steady for a device that is already formed by annealing at the formation temperature (Curve 38, device annealed at 560° C.). A drop in the value of steady current is associated with formation. A formed device which has undergone formation anneal at 560° C. does not vary much in its photo-response with cycling.

Figure 8:
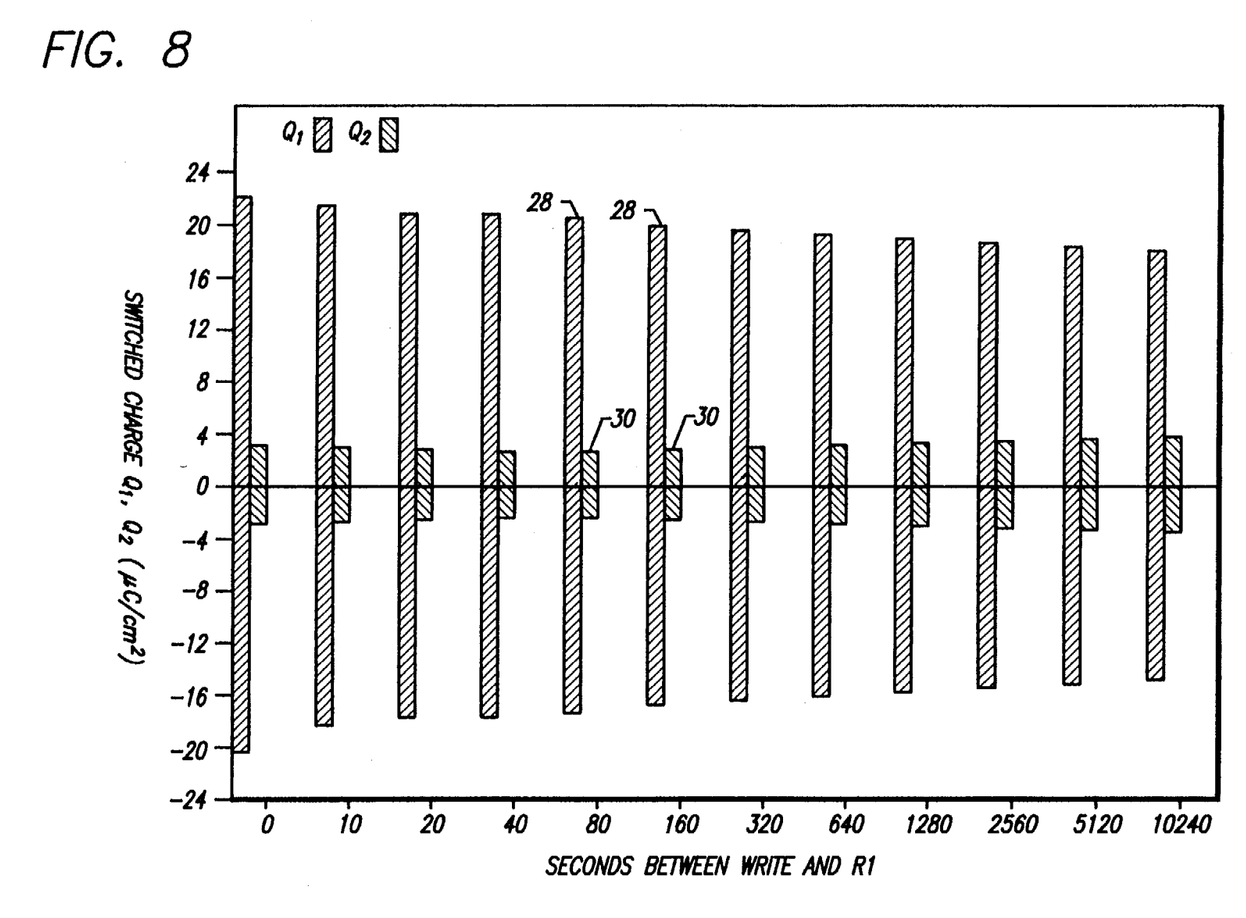
FIG. 8 is a histogram plot similar to that of FIG. 2, but showing the retention characteristics of a ferroelectric capacitor where the top electrode is annealed in accordance with the invention.

The reduction in the magnitude of Q2 30 as a function of annealing temperature allows enhancement in retained polarization signal. Of further significance is the reduction in the rate of increase of Q2 30 as a function of retention time. This latter effect is illustrated in FIG. 8. These effects both cooperate to provide an improved device 10.

Thus, there has been disclosed a method of reducing the charge associated with a non-switching pulse and its rate of change as a function of retention time in thin film ferroelectric capacitors comprising a bottom electrode, a top electrode, and a layer of ferroelectric material sandwiched therebetween. It will be readily apparent to those skilled in this art that various changes and modifications of an obvious nature may be made without departing from the spirit of the invention, and all such changes and modifications are considered to fall within the scope of the invention, as defined by the appended claims.

What is claimed is:

1. A method of improving non-volatile memory capabilities in thin film ferroelectric capacitors to provide more stable non-volatile memory operations in memory devices employing said thin film ferroelectric capacitors, said thin film ferroelectric capacitors comprising a bottom electrode, a top electrode, and a layer of ferroelectric material sandwiched therebetween, said ferroelectric material having a crystallization temperature and said layer of ferroelectric material and said top electrode forming an interface, said method comprising:

(a) depositing said layer of ferroelectric material on said bottom electrode;

(b) annealing said layer of ferroelectric material and said bottom electrode to crystallize said ferroelectric material;

(c) depositing said top electrode on said layer of ferroelectric material, said top electrode comprising an electrically conductive material selected from the group consisting of platinum and conducting oxides; and (d) stabilizing said interface after forming said top electrode on said layer of ferroelectric material, said stabilizing being done by (1) annealing said ferroelectric capacitors at a temperature ranging from said crystallization temperature to a temperature less than that at which any metal-rich filament would form or (2) laser annealing said ferroelectric capacitors through said top electrode or (3) electron bombarding said ferroelectric capacitors.

2. The method of claim 1 wherein said ferroelectric material is a titanate composition having a perovskite structure.

3. The method of claim 2 wherein said ferroelectric material comprises lead zirconate titanate.

4. The method of claim 3 wherein said lead zirconate titanate has a thickness ranging from about 0.10 to 0.20 $\mu$m.

5. The method of claim 1 wherein said ferroelectric material comprises lead zirconate titanate and wherein said annealing of step (d)(1) is done at a temperature of about 550° C. to 600° C. for a period of time ranging from about 10 to 15 minutes.

6. The method of claim 5 wherein said annealing is done at a temperature of about 560° C.

7. The method of claim 1 wherein said ferroelectric material comprises lead zirconate titanate and wherein said laser annealing is done at a energy of about 20 to 40 $\mu$J/cm$^2$.

8. The method of claim 7 wherein said laser annealing is done at a energy of about 20 to 24 $\mu$J/cm$^2$.

9. The method of claim 1 wherein said stabilizing is done by electron bombardment of said ferroelectric thin film capacitors through said top electrode.

10. The method of claim 9 wherein said ferroelectric material comprises lead zirconate titanate and wherein said electron bombardment is done at a fluence of greater than about $10^{13}$ electrons/cm$^2$ and less than about $10^{14}$ electrons/cm$^2$.

11. The method of claim 1 wherein said top electrode consists essentially of platinum having a thickness within the range of about 100 to 300 Å.

12. A method of improving non-volatile memory capabilities in thin film ferroelectric capacitors to provide more stable non-volatile memory operations in memory devices employing said thin film ferroelectric capacitors, said thin film ferroelectric capacitors comprising a bottom electrode, a top electrode, and a layer of ferroelectric material comprising lead zirconate titanate sandwiched therebetween, said method comprising:

(a) depositing said layer of ferroelectric material on said bottom electrode;

(b) annealing said layer of ferroelectric material and said bottom electrode to crystallize said ferroelectric material;

(c) depositing said top electrode on said layer of ferroelectric material, said top electrode consisting essentially of platinum having a thickness ranging from about 100 to 300 Å; and (d) annealing said thin film ferroelectric capacitor at a temperature ranging from about 550° to 600° C. for a period of time ranging from about 10 to 15 minutes, following deposition of said top electrode.

13. The method of claim 12 wherein said annealing of step (d) is accomplished by inserting said capacitors into a pre-heated air oven, maintaining said capacitors in said oven for said period of time, and extracting said capacitors from said oven.

14. The method of claim 12 wherein said lead zirconate titanate has a thickness ranging from about 0.10 to 0.20 $\mu$m.

* * * * *